(12) United States Patent
Jenne (10) Patent No.: US 7,206,247 B2
(45) Date of Patent: Apr. 17, 2007

(54) ANTIFUSE CIRCUIT WITH DYNAMIC CURRENT LIMITER

(75) Inventor: Fredrick B. Jenne, Los Gatos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 14 days.

(21) Appl. No.: 11/238,763

(22) Filed: Sep. 29, 2005

(65) Prior Publication Data

US 2006/0291316 A1 Dec. 28, 2006

Related U.S. Application Data

(63) Continuation-in-part of application No. 11/169,986, filed on Jun. 28, 2005.

(51) Int. Cl.
*G11C 17/18* (2006.01)

(52) U.S. Cl. .............................. 365/225.7; 365/225.6; 365/243

(58) Field of Classification Search ............. 365/225.7, 365/225.6, 243
See application file for complete search history.

(56) References Cited

U.S. PATENT DOCUMENTS 6,545,928 B1 * 4/2003 Bell ........................ 365/225.7

6,927,997 B2 8/2005 Lee et al.

OTHER PUBLICATIONS

Ben Kaczer, et al. "Consistent Model for Short-Channel nMOSFET After Hard Gate Oxide Breakdown", IEEE Transactions on Electron Devices. vol. 49, No. 3, Mar. 2002, pp. 507-513.
B.P. Linder, et al. "Gate Oxide Breakdown under Current Limited Constant Voltage Stress", IEEE, 2000 Symposium on VLS1 Technology Digest of Technical Papers. pp. 214-215.

* cited by examiner

*Primary Examiner*—Richard T. Elms
*Assistant Examiner*—Pho M. Luu
(74) *Attorney, Agent, or Firm*—Okamoto & Benedicto LLP (57) ABSTRACT

An antifuse cell includes a select transistor, a blocking transistor, and an antifuse. The select transistor allows for selection of the antifuse cell among an array of antifuse cells, while the blocking transistor limits the amount of voltage that may be directly applied to the select transistor. The antifuse may comprise a capacitor. Current used to program an antifuse cell is controlled using a programming current regulator. The programming current regulator may include components that form a current mirror with components of the antifuse cell to tightly control programming current through the antifuse. Dynamic current flowing through a substrate of an antifuse cell is limited using a current limiting resistor directly in series with an antifuse of the antifuse cell. The current limiting resistor minimizes or prevents excessive programming current.

20 Claims, 11 Drawing Sheets

ANTIFUSE CIRCUIT WITH DYNAMIC CURRENT LIMITER

REFERENCE TO RELATED APPLICATION

This application is a continuation-in-part of U.S. application Ser. No. 11/169,986, entitled "ANTIFUSE CAPACITOR FOR CONFIGURING INTEGRATED CIRCUITS," filed on Jun. 28, 2005 by Fred B. Jenne, incorporated herein by reference in its entirety.

BACKGROUND OF THE INVENTION

1. Field of the Invention

The present invention relates generally to integrated circuits, and more particularly but not exclusively to antifuse cells.

2. Description of the Background Art

Some integrated circuits may be configured in the field or the factory after fabrication. Examples of these integrated circuits include programmable logic devices (PLD), field programmable gate arrays (FPGA), read only memories (ROM), and clock circuits. An integrated circuit may be configured by "programming" (also referred to as "burning") information into it. Programming may involve blowing a fuse that connects two nodes of a circuit. The status of the fuse, i.e., whether it is open or shorted, may be determined by flowing read current through the nodes. An antifuse configures an integrated circuit in a manner opposite to that of a fuse. An antifuse provides an open circuit in a normal state, and provides a short when burned. The state of an antifuse may be read in a manner similar to that of a fuse.

SUMMARY

In one embodiment, an antifuse cell includes a select transistor, a blocking transistor, and an antifuse. The select transistor allows for selection of the antifuse cell among an array of antifuse cells, while the blocking transistor limits the amount of voltage that may be directly applied to the select transistor. The antifuse may comprise a capacitor. The capacitor may include a gate over a gate oxide and an n-well under the gate oxide. The n-well may have two n+ regions used as contact points for the n-well. Upon programming, an electrically conductive path is permanently burned through the gate oxide. The antifuse cell occupies a relatively small area while providing a relatively tight read current distribution.

In another embodiment, current used to program an antifuse cell is controlled using a programming current regulator. The programming current regulator may include components that form a current mirror with components of the antifuse cell to tightly control programming current through the antifuse. The programming antifuse resistance and resistance distribution are a function of the programming current. In general, the higher the programming current, the lower the resistance of the resulting electrically conductive path. Therefore, by controlling the programming current, one can get a desired mean resistance value with a relatively tight resistance distribution.

In yet another embodiment, dynamic current flowing to a substrate of an antifuse cell is limited using a dynamic current limiting resistor directly in series with an antifuse of the antifuse cell. The dynamic current limiting resistor helps prevent excessive programming current.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. The circuits disclosed herein are preferably, but not necessarily, implemented in an integrated circuit.

Figure 1:
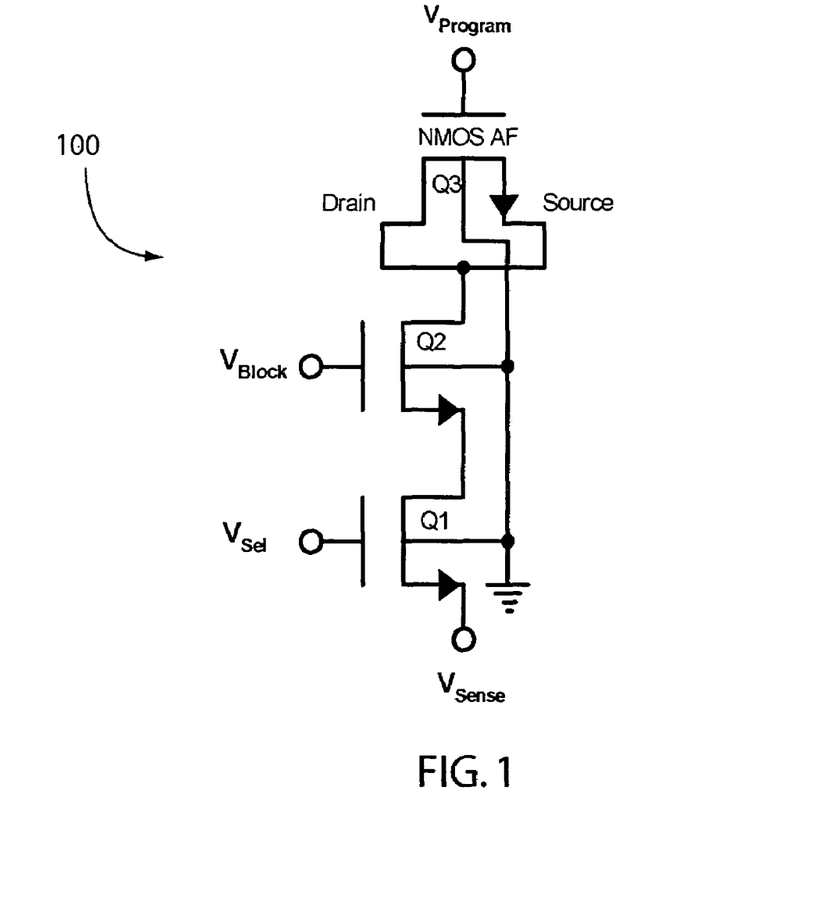
FIG. 1 schematically shows an example three transistor antifuse cell employing an NMOS transistor antifuse.

An antifuse is typically implemented as a cell in an array of antifuse cells. An example antifuse cell 100 is schematically shown in FIG. 1. In the example of FIG. 1, the antifuse cell 100 includes a select transistor Q1, a blocking transistor Q2, and an antifuse transistor Q3. The antifuse cell 100 is also referred to as a three transistor antifuse cell in that it consists of three transistors, including the antifuse itself. In the antifuse cell 100, a blocking voltage ($V_{BLOCK}$) is always applied on the gate of the transistor Q2 to prevent a relatively high programming voltage ($V_{PROGRAM}$) from being applied directly on the select transistor Q1. To program the antifuse cell 100, a programming voltage is applied on the gate of the antifuse transistor Q3 while a selection voltage ($V_{SELECT}$) is applied to the gate of the select transistor Q1 and a low voltage (e.g. 0 volt or ground) is applied to the source of the select transistor Q1. This turns ON the select transistor Q1 and allows current to flow through the gate oxide of antifuse transistor Q3, thereby burning a short through the gate oxide. The state of the antifuse transistor Q3 may be read by applying a blocking voltage on the gate of the transistor Q2, applying a reading voltage on the gate of the antifuse transistor Q3, applying a selection voltage on the gate of the select transistor Q1, and then reading the resulting current on the source of the select transistor Q1. If the antifuse transistor Q3 is burned, a resistive short allows current to flow from the gate of the transistor Q3 to the source of the select transistor Q1. Otherwise, there will be no current flow, indicating that the antifuse transistor Q3 has not been programmed and thus remains open.

Figure 2:
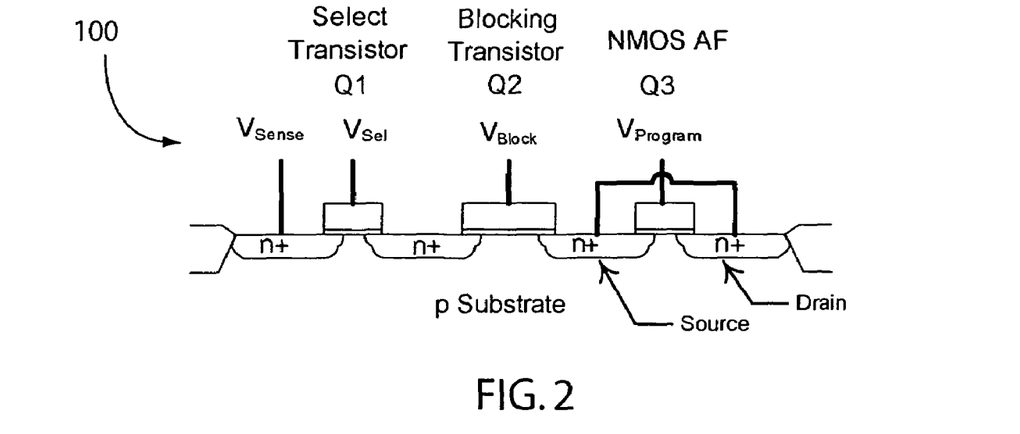
FIG. 2 schematically shows a cross-sectional view of an integrated circuit having the antifuse cell of FIG. 1.

FIG. 2 schematically shows a cross-sectional view of an integrated circuit having the antifuse cell 100. As shown in FIG. 2, the select transistor Q1 and the blocking transistor Q2 comprise NMOS transistors with n+ (i.e., heavily doped with an n-type dopant) regions for source and drain. Similarly, the antifuse transistor Q3 is an NMOS transistor having n+ source and drain regions that are shorted together. The antifuse cell 100 is formed on a p-type substrate. An n-channel is thus formed between the source and drain regions of the antifuse transistor Q3 when a positive voltage applied to its gate exceeds its threshold voltage.

Figure 3:
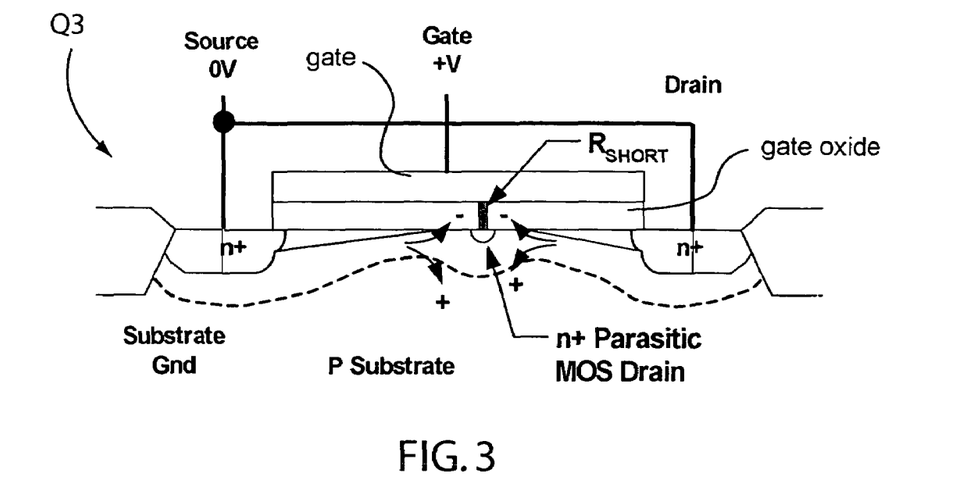
FIG. 3 schematically shows a cross-sectional view of the antifuse transistor of the antifuse cell of FIG. 1.

FIG. 3 schematically shows a cross-sectional view of the antifuse transistor Q3. Programming the antifuse transistor Q3 results in a resistive short ($R_{SHORT}$) being formed through the gate oxide. The resistive short may be read as previously described above. One problem with the antifuse transistor Q3 is that a diode forms through the resistive short. This diode forms a parasitic NMOS drain region that injects charge into the gate oxide during programming, resulting in a large undesirable distribution in threshold voltage and thus read current.

Figure 4:
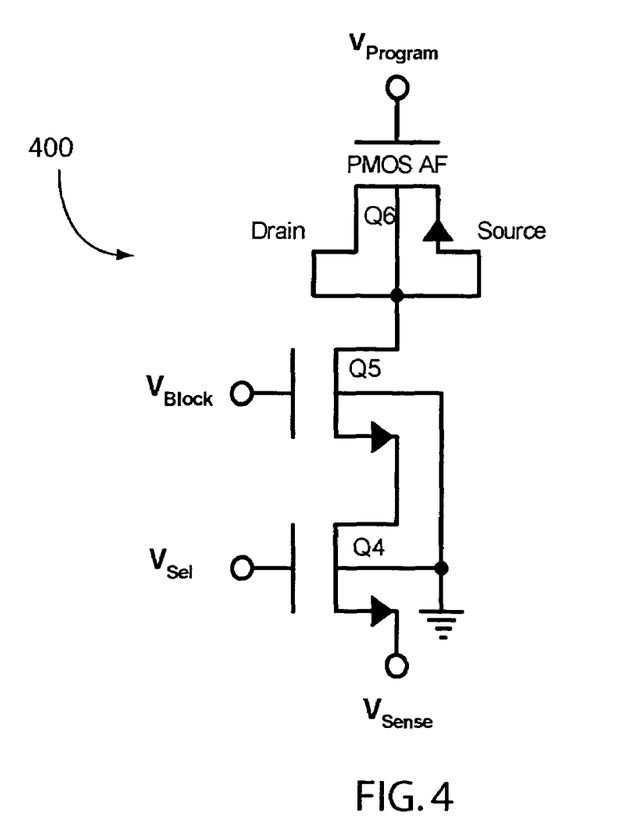
FIG. 4 schematically shows an example three transistor antifuse cell employing a PMOS transistor antifuse.

To eliminate the charge injection problem of the antifuse transistor Q3, a PMOS antifuse transistor may be employed as shown in the antifuse cell 400 of FIG. 4. The antifuse cell 400 is a three transistor antifuse cell that includes a select transistor Q4, a blocking transistor Q5, and an antifuse transistor Q6. The functionality and operation of the select transistor Q4 and the blocking transistor Q5 are similar to those of the select transistor Q1 and the blocking transistor Q2, respectively, of the previously described antifuse cell 100. The programming and reading of the antifuse cell 400 are also similar to those of the antifuse cell 100.

Figure 5:
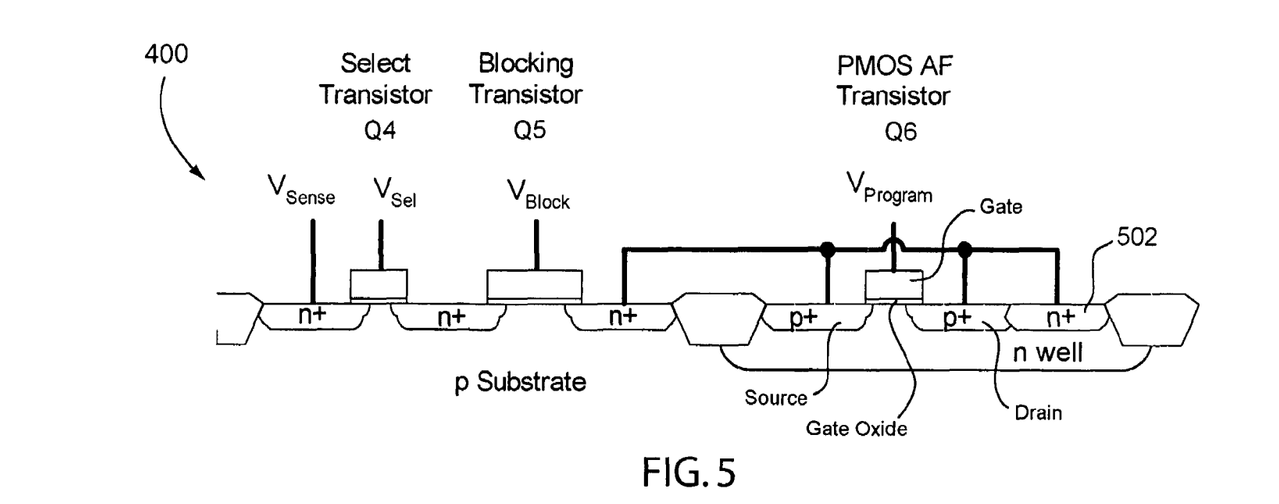
FIG. 5 schematically shows a cross-sectional view of an integrated circuit having the antifuse cell of FIG. 4.

FIG. 5 schematically shows a cross-sectional view of an integrated circuit having the antifuse cell 400. As shown in FIG. 5, the select transistor Q4 and the blocking transistor Q5 comprise NMOS transistors with n+ source and drain regions. The antifuse transistor Q6, on the other hand, comprises a PMOS transistor with p+ (i.e., heavily doped with a p-type dopant) source and drain regions. Upon programming, a resistive short (not shown) is burned through the gate oxide of the antifuse transistor Q6. To allow reading of the short, an n+ region 502 is formed in the same n-well where the p+ source and drain regions of the antifuse transistor Q6 are formed. The n+ region 502 is tied to the p+ source and drain regions of the antifuse transistor Q6 and to the drain of the blocking transistor Q5. This allows a reading voltage to be applied on the gate of the antifuse transistor Q6 and flow current through the resistive short in the gate oxide, the n+ region 502, the drain of the blocking transistor Q5 and so on.

Figure 6:
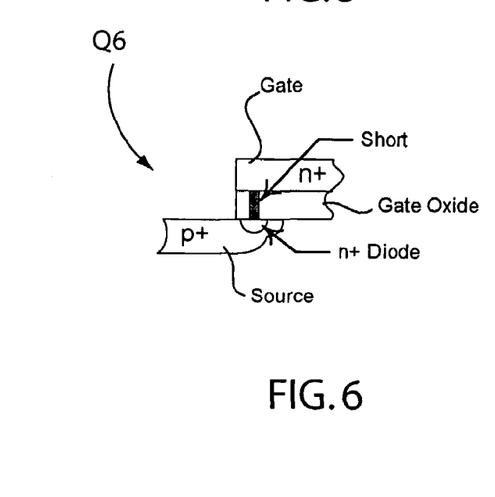
FIG. 6 schematically illustrates a possible problem with the antifuse transistor of the antifuse cell of FIG. 4.

One problem with the antifuse cell 400 is that the antifuse transistor Q6 requires a relatively large amount of silicon area. Another problem with the antifuse cell 400 is that the antifuse transistor Q6 may become defective when the resistive short is burned between the gate oxide and a p+ source/drain region instead of in the middle of the gate oxide. This problem is illustrated in FIG. 6, which shows a cross-section of a portion of the antifuse transistor Q6. In example of FIG. 6, a resistive short is burned through the gate oxide in a way that connects the p+ source region to the gate. The resistive short forms a diode to the source instead of a low resistance path to the n-well, thereby rendering the antifuse cell 400 defective.

Figure 7:
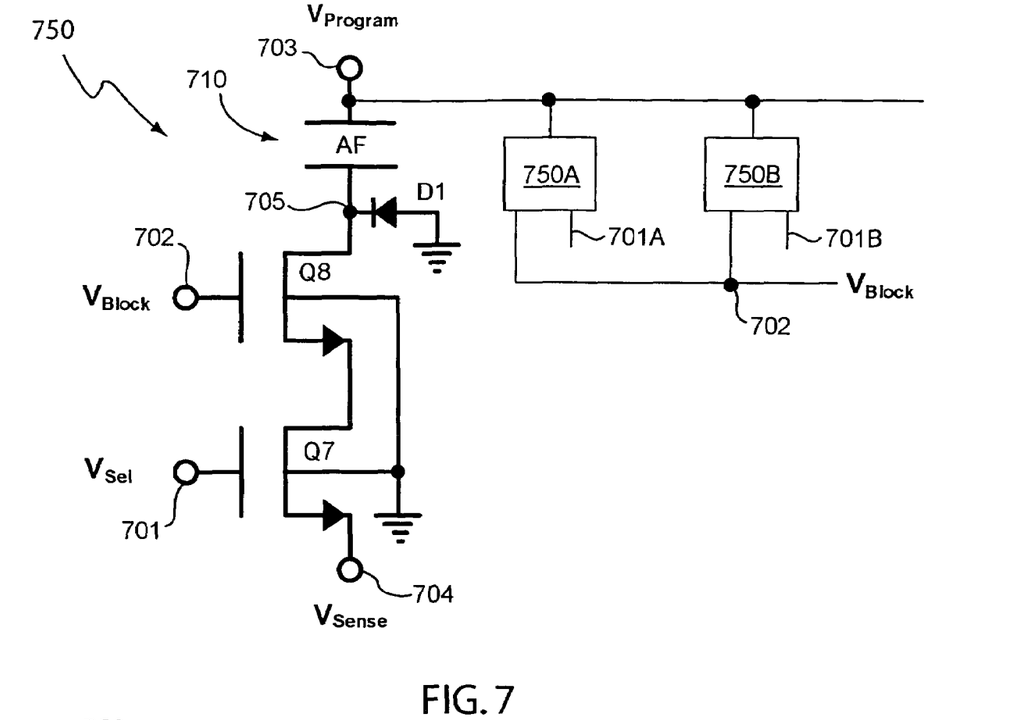
FIG. 7 schematically shows an antifuse cell in accordance with an embodiment of the present invention.

Referring now to FIG. 7, there is schematically shown an antifuse cell 750 in accordance with an embodiment of the present invention. In the example of FIG. 7, the antifuse cell 750 is a cell in an array of antifuse cells that includes antifuse cells 750A, 750B, and so on. In the example of FIG. 7, all antifuse cells in the array of antifuse cells are tied to the same blocking voltage $V_{BLOCK}$ at a common node 702. Each antifuse cell in the array of antifuse cells receives its own selection voltage $V_{SELECT}$ at a particular selection node. In the example of FIG. 7, the antifuse cell 750 receives its selection voltage at a node 701, the antifuse cell 750A receives its selection voltage at a node 701A, the antifuse cell 750B receives its selection voltage at a node 701B, and so on. Applying a selection voltage at a particular antifuse cell selects that cell for operation (e.g., reading or programming).

Antifuse cell 750 is the same as the other antifuse cells (i.e. 750A, 750B, . . . ) in the array, and will be used as an example in this disclosure. In the example of FIG. 7, the antifuse cell 750 comprises a select transistor Q7, a blocking transistor Q8, and an antifuse 710. As will be more apparent below, the antifuse 710 comprises one or more diodes D1 and a capacitor. The blocking voltage $V_{BLOCK}$ (e.g. 3.3 volts) is tied to the gate of all the blocking transistors in the array to turn ON the blocking transistors and prevent a relatively high programming voltage $V_{PROGRAM}$ (e.g. 7.5 volts) from being applied directly to corresponding select transistors. Using antifuse cell 750 as an example, turning ON the blocking transistor Q8 allows for current to flow from the antifuse 710 to the select transistor Q7 while preventing the programming voltage $V_{PROGRAM}$ at a node 703 from being applied directly to the transistor Q7. The blocking transistor Q8 thus prevents the relatively thin gate oxide of the select transistor Q7 from breaking down during programming. This advantageously allows the antifuse cell 750 to be readily employed in a variety of circuitry, even pre-existing ones with relatively thin gate oxides, with minimal or no process integration requirement. In one embodiment, the blocking transistor Q8 is always ON during normal operation.

To program the antifuse cell 750, the antifuse cell 750 is selected by turning ON the select transistor Q7. In one embodiment, the select transistor Q7 is turned ON by applying a selection voltage $V_{SELECT}$ (e.g. 1.8 volts) on its gate at the node 701. The node 704 is placed at ground potential and a programming voltage $V_{PROGRAM}$ (e.g. 7.5 volts) is applied at the node 703. This results in the node 705 being pulled to ground and the programming voltage being applied across the antifuse 710, and current flowing from the node 703, through the antifuse 710, through the blocking transistor Q8, through the select transistor Q7, and to the node 704. The current flow through the antifuse 710 burns an electrically conductive path, in this case a short (e.g. about 5 kΩ), through the antifuse 710 between the node 703 and a node 705. The antifuse 710 is also referred to as a one-time-programmable (OTP) antifuse in that the short permanently remains after programming.

To determine the state of the antifuse cell 750, the antifuse cell 750 is again selected by turning ON the select transistor Q8. A read voltage (e.g. 1.8 volts) is applied on the node 703 and a sense voltage $V_{SENSE}$ (or corresponding read current) is detected at the node 704. If the antifuse 710 is burned (i.e. there is a short between nodes 703 and 705), current will flow from the node 703 to the node 704. Otherwise, the antifuse 710 will be open, preventing current flow to the node 704. The sense voltage $V_{SENSE}$ will vary depending on whether the antifuse 710 is burned or not.

Figure 8:
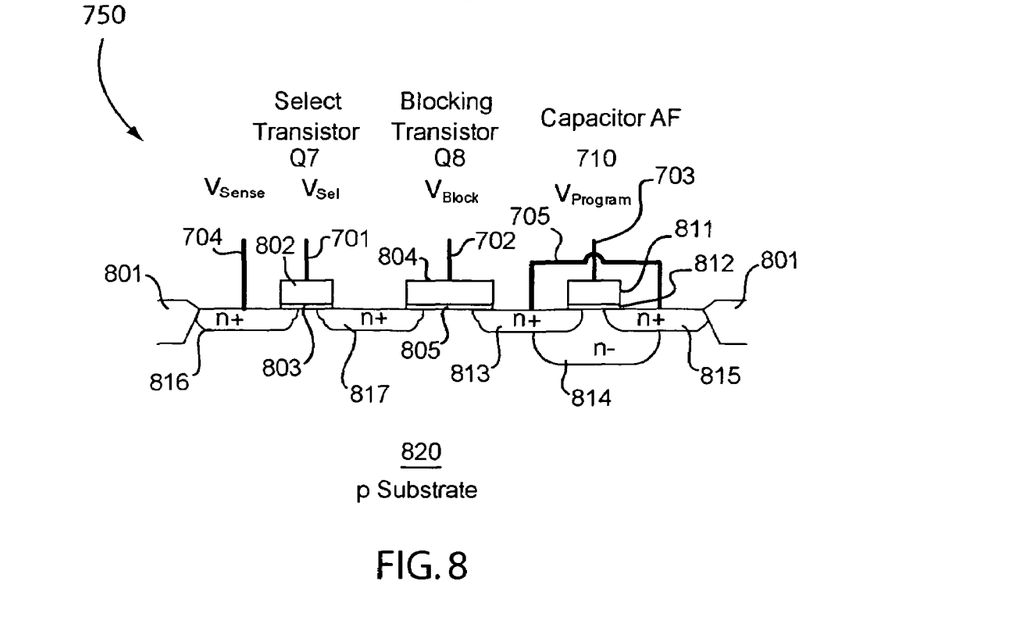
FIG. 8 shows a cross-sectional view of an integrated circuit having the antifuse cell of FIG. 7.

FIG. 8 shows a cross-sectional view of an integrated circuit having the antifuse cell 750 in accordance with an embodiment of the present invention. In the example of FIG. 8, the antifuse cell 750 is formed in a p-type semiconductor substrate 820. Shallow trench isolation (STI) structures 801 separate the antifuse cell 750 from other circuitry on the substrate 820. In the example of FIG. 8 (and FIG. 7), the select transistor Q7 and the blocking transistor Q8 are NMOS transistors. Accordingly, the select transistor Q7 and blocking transistor Q8 have n+ source and drain regions. In one embodiment, the select transistor Q7 has a polysilicon gate 802 that is about 2700 Angstroms thick and a gate oxide 803 that is about 32 Angstroms thick. The select transistor Q7 has an n+ source 816 connected to the node 704 used for detecting a sense voltage (or read current). The select transistor Q7 uses an n+ region 817 as a drain, which is also used by the blocking transistor Q8 as a source. Applying a positive selection voltage that exceeds a threshold voltage at the node 701 forms an n-channel between the n+ regions 816 and 817 to allow current flow and thus select the antifuse cell 750.

In one embodiment, the blocking transistor Q8 has a polysilicon gate 804 that is about 1800 Angstroms thick and a gate oxide 805 that is about 55 Angstroms thick. The blocking transistor Q8 uses the n+ region 817 as a source and the n+ region 813 as a drain. Applying a positive voltage that exceeds a threshold voltage at the node 702 forms an n-channel between n+ regions 817 and 813. This allows current flow to the select transistor Q7 while preventing direct application of a relatively high voltage thereto.

As mentioned, the antifuse 710 may comprise a capacitor and one or more diodes. The capacitor, which is also referred to herein as "antifuse capacitor," is formed by a gate 811, a gate oxide 812, and an n-well 814. The gate 811, the gate oxide 812, and the n-well 814 serve as the capacitor top plate, dielectric, and bottom plate, respectively. A lightly doped n-well 814 (n−) electrically connects the n+ regions 813 and 815. Because of this connection, n+ regions 813 and 815 are not serving as source and drain regions in the antifuse 710. Put another way, the antifuse 710 has no source or drain. The n+ regions 813 and 815, which serve as contact points to the n-well 814 (i.e. the bottom plate of the capacitor), are tied together to the node 705 (see also FIG. 7). Note that the n+ region 813 also serves as the drain of the blocking transistor Q8. This means that the bottom plate of the antifuse capacitor is tied to the drain of the blocking transistor Q8. A short through the gate oxide 812 thus results in a relatively very low resistance path (e.g. about 5 kΩ) from the node 703 to the node 705.

There are several diodes formed in the antifuse 710. One diode is formed by the n+ region 813 and the p-type substrate 820, another diode is formed by the n-well 814 and the p-type substrate 820, and yet another diode is formed by the n+ region 815 and the p-type substrate 820. The p-type substrate 820, which serves as the anode of these diodes, provides a connection to ground (see anode of the diode D1 in FIG. 7). The cathode (i.e., n+ region 813, n-well 814, and n+ region 815) of these diodes are all tied to the node 705 (see cathode of the diode D1 in FIG. 7). These diodes are represented by the diode D1 in FIG. 7.

Figure 9:
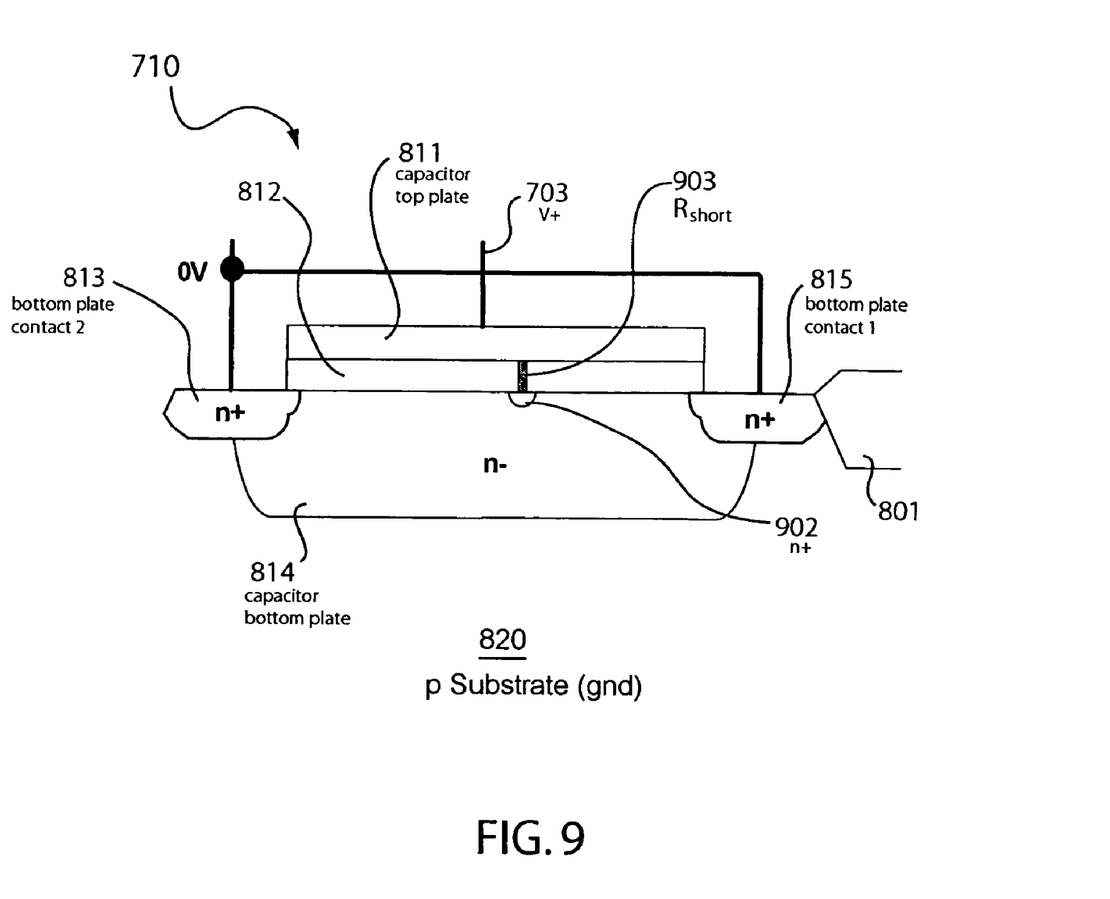
FIG. 9 schematically shows a closer view of an antifuse in the antifuse cell shown in FIG. 8.

FIG. 9 schematically shows a closer view of the antifuse 710. In one embodiment, the gate 811 comprises polysilicon formed to a thickness of about 1800 Angstroms and the gate oxide 812 is formed to a thickness of about 32 Angstroms. Applying a positive programming voltage on the gate 811 at the node 703 during programming burns a resistive short 903 ($R_{SHORT}$; e.g. a resistance of about 5 kΩ) through the gate oxide 812. An n+ region 902 may form on the end of the resistive short 903. However, the n+ region 902 has no adverse effect because it has the same polarity as the n-well 814. The other reference labels shown in FIG. 9 have been previously discussed and are provided for reference purposes.

Figure 10:
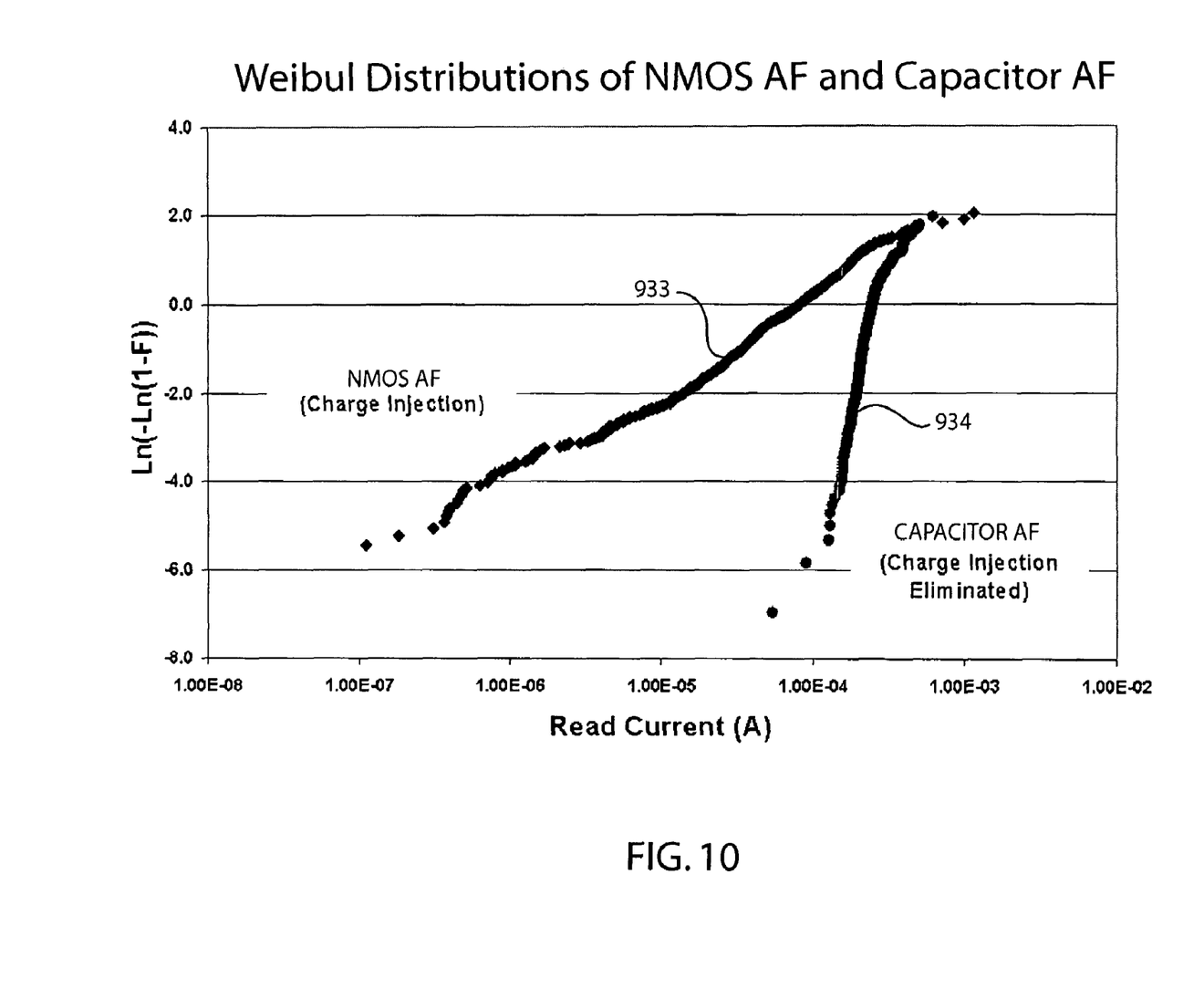
FIG. 10 shows Weibull distributions comparing the antifuse cell of FIG. 7 to the antifuse cell of FIG. 1.

One advantage of the antifuse cell 750 is that it provides a relatively tight read current distribution compared to antifuse cells employing an NMOS antifuse transistor. The capacitor of the antifuse 710 eliminates the saturated drain region charge injection issue that has plagued NMOS antifuse transistors. FIG. 10 shows example Weibull distributions of read currents for an antifuse cell 100 (i.e. with an NMOS antifuse transistor) and an antifuse cell 750 (i.e. with an antifuse capacitor). The plot 933 is for the antifuse cell 100, while the plot 934 is for the antifuse cell 750. From FIG. 10, it can be seen that the antifuse cell 100 has a larger read current tail compared to the antifuse cell 750.

Another advantage of the antifuse cell 750 is that it requires a relatively small area compared to antifuse cells employing a PMOS antifuse transistor. Comparing FIG. 5 to FIG. 8, the antifuse cell 400 requires a relatively large area because it needs the n+ region 502 to connect the burned resistive short to the rest of the cell. In some cases, the antifuse cell 400 may require about 30% more space compared to the antifuse cell 750. The increased space requirement of the antifuse cell 400 leads to higher per die cost and smaller number of devices on the wafer. Furthermore, in the antifuse cell 750, a short may be burned through the gate oxide to connect the gate to a highly doped region (n+ in the case of the antifuse 710) without rendering the antifuse cell 750 defective.

In another aspect of the present invention, the programming current used to burn an electrically conductive path through an antifuse is controlled using a current regulator. This aspect of the present invention is now discussed with reference to FIGS. 11–13.

Figure 11:
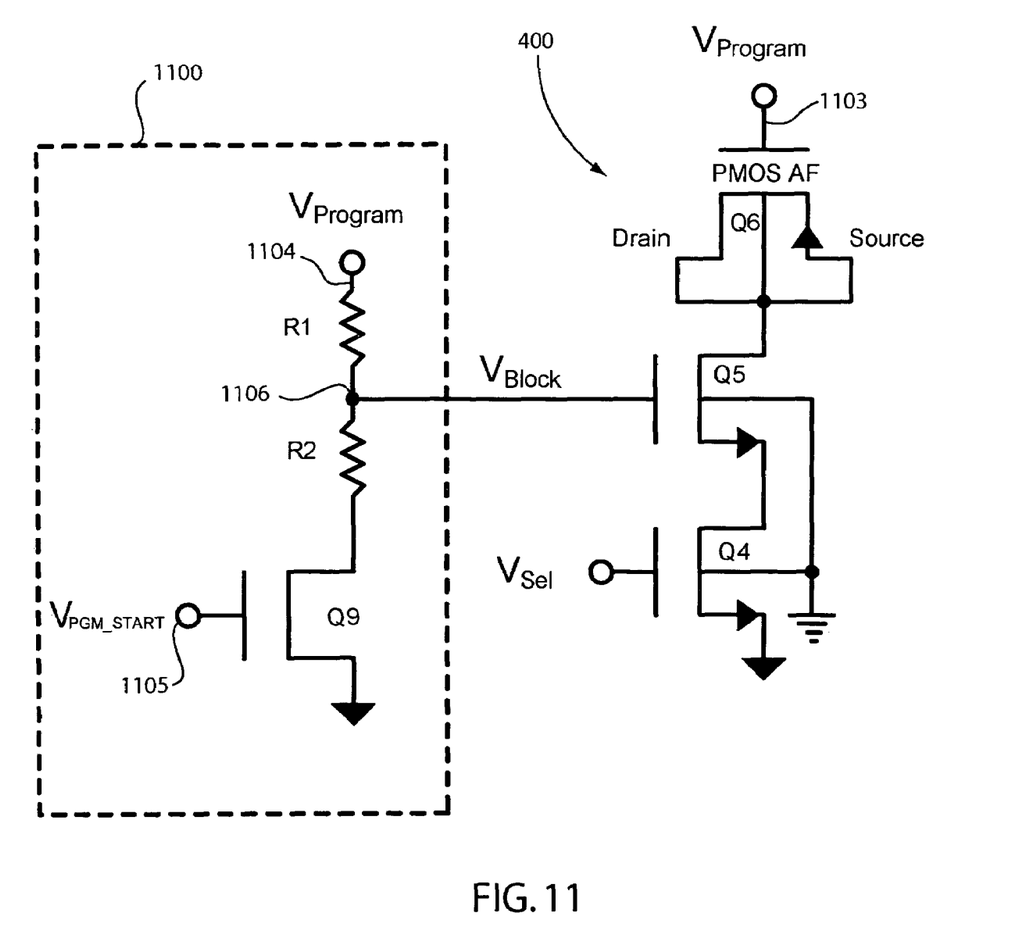
FIG. 11 schematically shows an example blocking voltage generation circuit.

FIG. 11 schematically shows an example blocking voltage generation circuit 1100. As its name implies, the circuit 1100 generates a blocking voltage ($V_{Block}$) for turning ON blocking transistor Q5 of antifuse cell 400. The operation and components of antifuse cell 400 have been previously discussed with reference to FIG. 4. In circuit 1100, a voltage divider network consisting of resistors R1 and R2 scales the programming voltage applied at node 1104 to a blocking voltage at node 1106. During programming of antifuse cell 400, a program start voltage ($V_{PGM\_START}$) is applied to the gate of NMOS transistor Q9 at node 1105. This turns ON transistor Q9 and allows current to flow from node 1104 to ground through transistor Q9. This, in turn, results in the blocking voltage at node 1106 being sufficient to turn ON blocking transistor Q5 to protect select transistor Q4 from the relatively high programming voltage, which is also applied at node 1103. As is evident in FIG. 11, the value of the blocking voltage for turning ON transistor Q5 during programming depends on the fixed programming voltage applied on node 1104 and the values of resistors R1 and R2.

One problem with the circuit 1100 is that variations in the process employed to manufacture the integrated circuit containing the circuit 1100 and antifuse cell 400 may result in variations in the values of the components of circuit 1100. This may result in variations in the blocking voltage applied at the gate of blocking transistor Q5, and thus variations in the programming current flowing through the antifuse transistor Q6.

Manufacturing process variations may increase the spread in the programming current, sometimes by more than 200%. Because the resistance of the electrically conductive path burned through the antifuse is related to the programming current, the increased spread in programming current also increases the spread in the read current.

Figure 12:
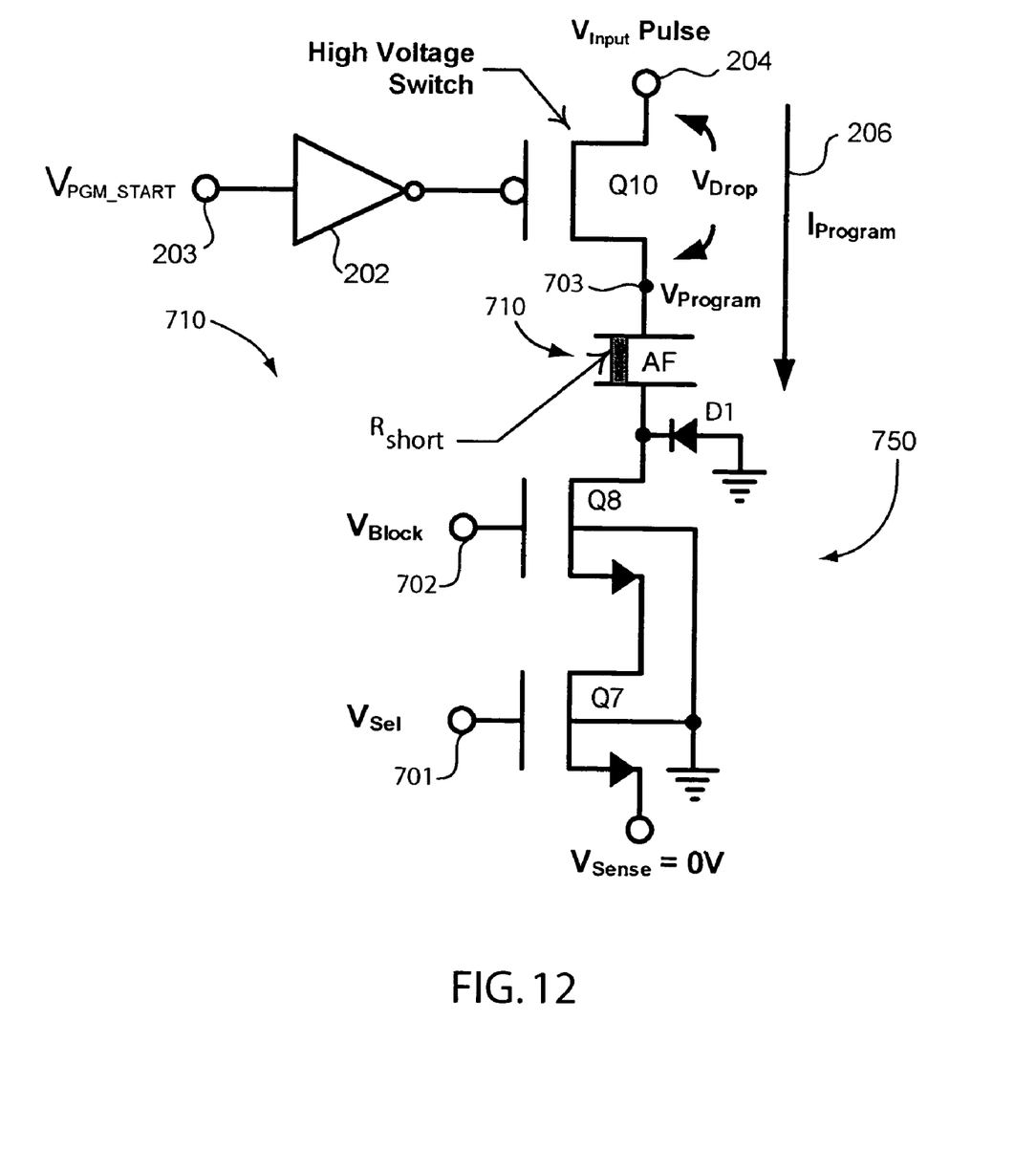
FIG. 12 schematically shows an antifuse cell with a programming circuit.

FIG. 12 schematically shows the antifuse cell 750 and a programming circuit comprising an amplifier 202 and a transistor Q10. The transistor Q10 serves as a high voltage switch for the relatively high (e.g. 7.5V) input voltage ($V_{Input}$) pulse used to provide the programming voltage. The operation and components of the antifuse cell 750 have been previously discussed with reference to FIG. 7. In the example of FIG. 12, the programming voltage $V_{Program}$ applied at node 703 during programming is from the input voltage pulse applied at a node 204. A program start voltage ($V_{PGM\_START}$) is applied at the input of the amplifier 202 at node 203 to start the programming. This results in the amplifier 202 generating a control voltage to turn ON transistor Q10, thereby applying the input voltage pulse as programming voltage at node 703. During programming, a programming current ($I_{Program}$) flows through the antifuse 710 as indicated by arrow 206. The programming current burns an electrically conductive path, labeled as $R_{short}$, through the antifuse 710. As can be appreciated from FIG. 12, the larger the programming current, the larger the voltage drop across transistor Q10. Therefore, if the spread in programming current is relatively wide, as is the case in the example of FIG. 11, the spread in the resistance of $R_{short}$ may be unacceptably large and cause read failures and/or cause antifuse failures by excessively large programming current that blows open the antifuse.

Figure 13:
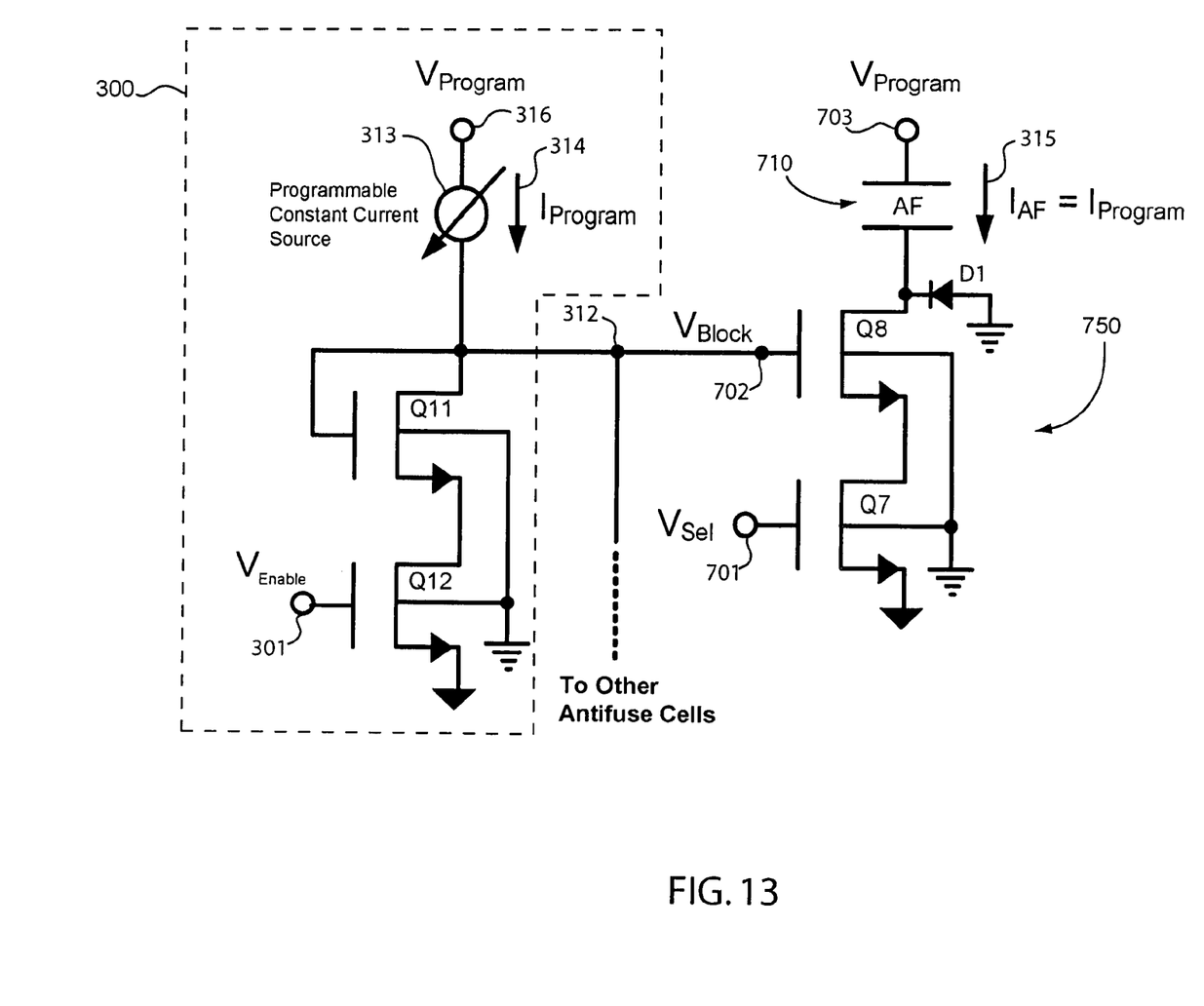
FIG. 13 schematically shows a programming current regulator in accordance with an embodiment of the present invention.

Referring now to FIG. 13, there is schematically shown a programming current regulator 300 in accordance with an embodiment of the present invention. In the example of FIG. 13, the regulator 300 is employed to control the programming current $I_{AF}$ through the antifuse 710. In one embodiment, the regular 300 comprises a programmable constant current source 313, an NMOS transistor Q11, and an NMOS transistor Q12. Preferably, the transistors Q11 and Q12 are fabricated as a cell in the array of the antifuse cells that includes antifuse cell 750. This advantageously allows the parameters of transistors Q11 and Q12 to change with those of transistors Q7 and Q8 when the manufacturing process varies.

To program the antifuse cell 750, a selection voltage ($V_{Sel}$) is applied at node 701 to turn ON select transistor Q7 and select antifuse cell 750 among the antifuse cells in the array. An enable voltage ($V_{Enable}$) is applied at the gate of transistor Q12 to enable current flow through transistors Q11 and Q12. Unlike the selection voltage applied to select transistor Q7, the enable voltage is applied to transistor Q12 whenever any antifuse cell in the array is programmed. That is, the enable voltage is common to all antifuse cells in the array. Of course, more than one regulator 300 may be employed per array of antifuse cells. In that case, the enable voltage is applied to transistor Q12 to enable the regulator 300 during programming of an antifuse cell coupled to the regulator 300 at node 312.

In the example of FIG. 13, transistors Q11 and Q12 form a current mirror with transistors Q8 and Q7. Programmable constant current source 313 is configured to generate a programming current $I_{Program}$ as indicated by arrow 314. During programming, an antifuse current $I_{AF}$ flows through the antifuse 710 as indicated by arrow 315. Because of the mirroring arrangement of transistors Q11 and Q12 and transistors Q8 and Q7, the antifuse current through the antifuse 710 is substantially the same as the programming current generated by programmable constant current source 313. That is, the antifuse current through the antifuse 710 is a mirror current of the programming current generated by the programmable constant current source 313. As can be appreciated, this advantageously provides a stable and tightly controlled programming current for antifuse cell 750. Other antifuse cells (e.g., see FIG. 7 antifuse cells 750A, 750B, . . . ) in the array of antifuse cells may tap off a node 312 just like antifuse cell 750 to form current mirrors with transistors Q11 and Q12 and receive a tightly controlled programming current. The regulator 300 thus minimizes problems associated with widely varying programming current, such as large spread in read current or the need for relatively large high voltage switch (e.g. see transistor Q10 in FIG. 12), thereby reducing manufacturing cost.

During programming, a relatively large amount of energy is released to form an electrically conductive path through the antifuse. If not controlled, this amount of energy can damage the antifuse. In another aspect of the present invention, a dynamic current limiting resistor is employed to limit dynamic current flowing to ground by way of the substrate of the antifuse. This aspect of the present invention is now discussed with reference to FIGS. 14 and 15.

Figure 14:
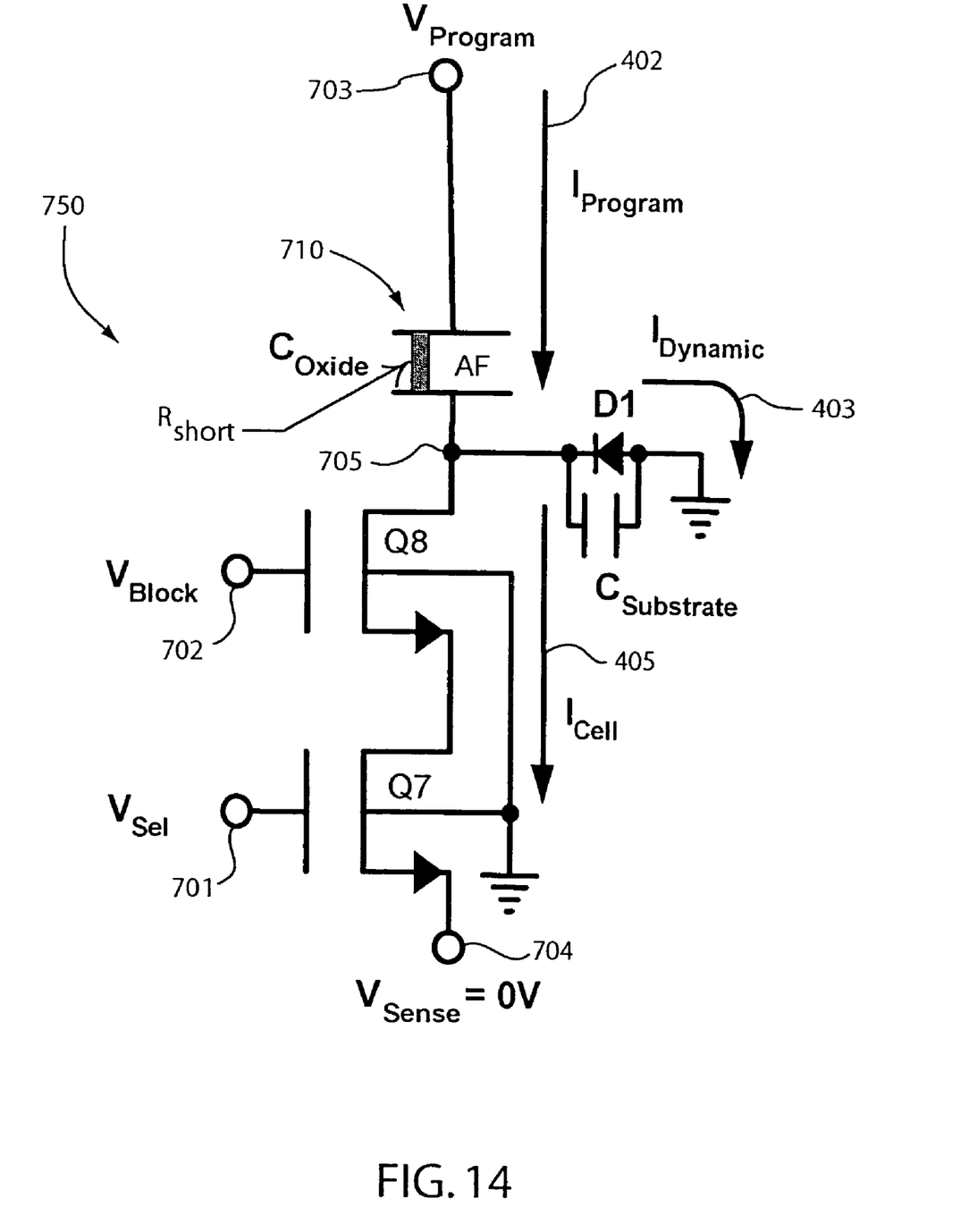
FIG. 14 schematically illustrates current flow through an antifuse cell during programming.

FIG. 14 schematically illustrates current flow through the previously discussed antifuse cell 750 during programming. The programming current $I_{Program}$ flows through the antifuse 710 as indicated by arrow 402. The programming current breaks down the gate oxide of the antifuse capacitor ($C_{oxide}$) (see gate oxide 812 in FIGS. 8 and 9) of the antifuse 710 to form an electrically conductive path ($R_{short}$, e.g. 5 k$\Omega$) through it. The programming current splits at node 705. Part of the programming current flows through transistors Q8 and Q7 as cell current $I_{Cell}$ as indicated by arrow 405. The remaining part of the programming current flows through the diode D1 and substrate capacitance $C_{Substrate}$ (see substrate 820 in FIG. 9) as dynamic current $I_{Dynamic}$ as indicated by arrow 403. The dynamic current $I_{Dynamic}$ flows to ground by way of the substrate of the antifuse 710. Although the cell current $I_{Cell}$ is limited by the blocking transistor Q8 and select transistor Q7, the dynamic current $I_{Dynamic}$ is not constrained. It is thus possible for the dynamic current to damage the antifuse 710 such that there is undesirable spread in the resistance of the electrically conductive path $R_{Short}$.

Figure 15:
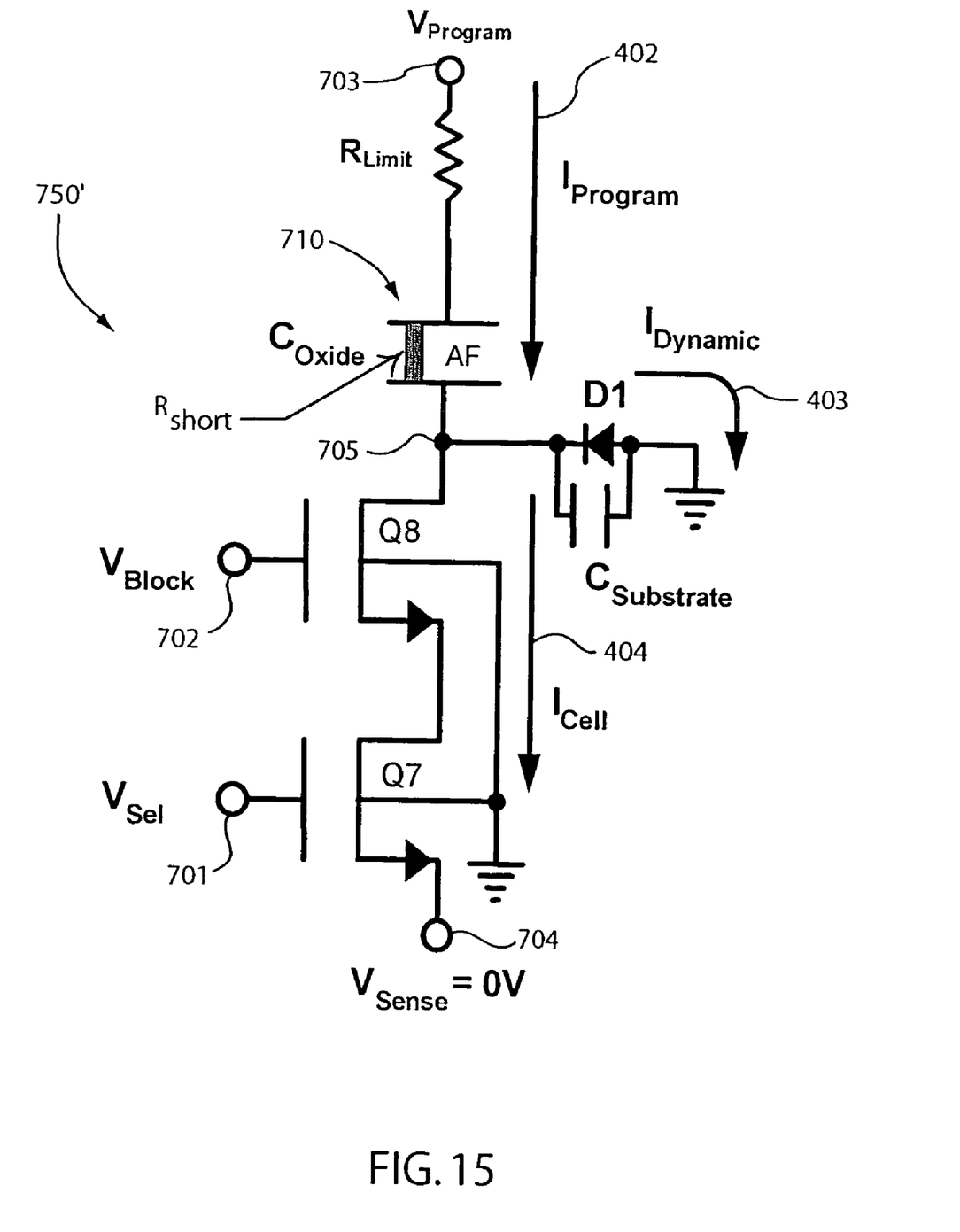
FIG. 15 schematically shows an antifuse cell with a dynamic current limiting resistor in accordance with an embodiment of the present invention.

Referring now to FIG. 15, there is schematically shown an antifuse cell 750' in accordance with an embodiment of the present invention. The operation and components of the antifuse cell 750' and the previously discussed antifuse cell 750 are the same except for the addition of a dynamic current limiting resistor $R_{Limit}$ in the antifuse cell 750'. In one embodiment, the dynamic current limiting resistor $R_{Limit}$ has a value of about 1K ohm.

Preferably, the limiting resistor $R_{Limit}$ is in series between the capacitor top plate (see top plate 811 of FIG. 9) of the antifuse 710 and the node where the programming voltage $V_{Program}$ is applied to the antifuse cell (e.g. node 703). The dynamic current limiting resistor $R_{Limit}$ advantageously limits the dynamic current flowing to ground by way of the substrate of the antifuse capacitor to prevent excessive current during programming.

An improved antifuse cell and associated circuitry have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An antifuse cell comprising:
    an antifuse comprising a capacitor, the capacitor having a first end and a second end, the first end of the capacitor being configured to receive a programming voltage to burn an electrically conductive path through the capacitor when the antifuse cell is selected;
    a select transistor configured to allow selection of the antifuse cell among a plurality of antifuse cells;
    a blocking transistor configured to limit an amount of voltage applied to the select transistor; and
    a dynamic current limiting resistor in series with the capacitor to limit dynamic current flowing to ground by way of a substrate of the antifuse during programming of the antifuse cell.

2. The antifuse cell of claim 1 wherein the antifuse further comprises a diode having a cathode end coupled to the second end of the capacitor and an anode end coupled to ground.

3. The antifuse cell of claim 2 wherein the second end of the of the capacitor is coupled to a drain of the blocking transistor, a drain of the select transistor is coupled to a source of the blocking transistor, and a source of the select transistor allows for sensing of a state of the antifuse.

4. The antifuse cell of claim 1 wherein the capacitor comprises:
    a polysilicon gate serving as a top plate of the capacitor;
    an n-well serving as a bottom plate of the capacitor; and
    a gate oxide between the polysilicon gate and the n-well, the gate oxide serving as a dielectric of the capacitor.

5. The antifuse cell of claim 4 further comprising:
    a first n+ region; and
    a second n+ region, wherein the n-well lies between the first and second n+ regions.

6. The antifuse cell of claim 5 wherein the first and second n+ regions are shorted together.

7. The antifuse cell of claim 4 wherein the polysilicon gate is the first end of the capacitor.

8. The antifuse cell of claim 1 wherein the capacitor is coupled to ground by way of a p-type substrate where the capacitor is formed.

9. The antifuse cell of claim 1 wherein the electrically conductive path has a resistance of about 5 kΩ.

10. The antifuse cell of claim 1 wherein the capacitor is formed in a p-type substrate.

11. The antifuse cell of claim 1 wherein the blocking transistor and the select transistor comprise MOS transistors.

12. The antifuse cell of claim 1 where the blocking transistor and the select transistor comprises NMOS transistors with a common n+ region.

13. A method of programming an antifuse cell of an integrated circuit, the method comprising:
    selecting an antifuse cell in an array of antifuse cells, the antifuse cell comprising an antifuse having a capacitor;
    applying a programming voltage at a first node of the antifuse cell to program the antifuse cell by burning an electrically conductive path through an oxide of the capacitor; and
    using a dynamic current limiting resistor to limit a dynamic current flowing to ground through a substrate of the antifuse during programming, the dynamic current limiting resistor being in series with a programming current flowing through the oxide.

14. The method of claim 13 further comprising:
    preventing the programming voltage from being directly applied to a transistor used to select the antifuse cell.

15. The method of claim 13 wherein the dynamic current limiting resistor is located in series between the first node and a top plate of the capacitor.

16. The method of claim 13 wherein the capacitor comprises a gate serving as a top plate of the capacitor, an n-well serving as a bottom plate of the capacitor, and the oxide serving as a dielectric of the capacitor.

17. An antifuse cell programmable using the method of claim 13.

18. An antifuse cell comprising:
    capacitor means for creating a short through a gate oxide in response to a signal to program the antifuse cell, the capacitor means comprising a capacitor;
    selection means for selecting the antifuse cell for programming or reading;
    blocking means for limiting an amount of voltage applied to the selection means; and
    current limiting means for limiting dynamic current flowing to ground by way of a substrate of the antifuse cell during programming of the antifuse cell.

19. The antifuse cell of claim 18 wherein the capacitor means comprises two active n+ regions separated by an n-well.

20. The antifuse cell of claim 18 wherein the selection means and the blocking means comprise NMOS transistors.

* * * * *